(12) United States Patent
Oh et al.

(10) Patent No.: US 9,123,655 B2
(45) Date of Patent: Sep. 1, 2015

(54) METHODS OF FORMING LAYER PATTERNS OF A SEMICONDUCTOR DEVICE

(71) Applicant: SAMSUNG ELECTRONICS CO., LTD., Suwon-si, Gyeonggi-do (KR)

(72) Inventors: Tae-Hwan Oh, Goyang-si (KR); Yu-Ra Kim, Seoul (KR); Tae-Sun Kim, Hwaseong-si (KR); Kwang-Sub Yoon, Yongin-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/190,797

(22) Filed: Feb. 26, 2014

(65) Prior Publication Data

US 2014/0242800 A1    Aug. 28, 2014

(30) Foreign Application Priority Data

Feb. 26, 2013 (KR) ........................ 10-2013-0020204

(51) Int. Cl.
 *H01L 21/311* (2006.01)
 *H01L 21/308* (2006.01)
 *H01L 21/306* (2006.01)

(52) U.S. Cl.
 CPC ........ *H01L 21/3086* (2013.01); *H01L 21/3081* (2013.01); *H01L 21/30604* (2013.01)

(58) Field of Classification Search
 USPC ......................................................... 438/703
 See application file for complete search history.

(56) References Cited

U.S. PATENT DOCUMENTS

| | | | | |
|---|---|---|---|---|
| 6,004,722 A | * | 12/1999 | Zhang et al. | 430/271.1 |
| 6,329,117 B1 | * | 12/2001 | Padmanaban et al. | 430/270.1 |
| 7,514,368 B2 | | 4/2009 | Jang | |
| 7,598,182 B2 | | 10/2009 | Hatanaka et al. | |
| 7,638,262 B2 | | 12/2009 | Wu et al. | |
| 2003/0211684 A1 | | 11/2003 | Guo | |
| 2005/0148170 A1 | * | 7/2005 | Bhave et al. | 438/637 |
| 2005/0181209 A1 | * | 8/2005 | Karandikar | 428/408 |
| 2005/0181299 A1 | * | 8/2005 | Trefonas et al. | 430/270.1 |
| 2008/0076244 A1 | | 3/2008 | Ye et al. | |

FOREIGN PATENT DOCUMENTS

| | | |
|---|---|---|
| JP | 05-109779 A | 4/1993 |
| JP | 5-152345 A | 6/1993 |
| KR | 1999-006192 A | 1/1999 |
| KR | 10-0562323 B | 3/2006 |
| KR | 10-2009-0098133 A | 9/2009 |
| KR | 10-2011-0077484 A | 7/2011 |

* cited by examiner

*Primary Examiner* — Asok K Sarkar

(74) *Attorney, Agent, or Firm* — Lee & Morse, P.C.

(57) ABSTRACT

A method of manufacturing a layer pattern of a semiconductor device, the method including forming an anti-reflective coating (ARC) layer on an etching object layer such that the ARC layer includes a polymer having an imide group; forming a photoresist pattern on the ARC layer; wet etching portions of the ARC layer exposed by the photoresist pattern to form an ARC layer pattern; and etching the etching object layer using the photoresist pattern as an etch mask to form the layer pattern.

20 Claims, 9 Drawing Sheets

METHODS OF FORMING LAYER PATTERNS OF A SEMICONDUCTOR DEVICE

CROSS-REFERENCE TO RELATED APPLICATION

Korean Patent Application No. 10-2013-0020204, filed on Feb. 26, 2013, in the Korean Intellectual Property Office, and entitled: "Methods of Forming layer Patterns of a Semiconductor Device," is incorporated by reference herein in its entirety.

BACKGROUND

1. Field

Embodiments relate to methods of forming layer patterns of a semiconductor device.

2. Description of the Related Art

In a process of manufacturing a semiconductor device, an etching object layer may be etched using an etch mask including an anti-reflective coating (ARC) layer and a photoresist pattern to form a pattern.

SUMMARY

Embodiments are directed to methods of forming layer patterns of a semiconductor device.

The embodiments may be realized by providing a method of manufacturing a layer pattern of a semiconductor device, the method including forming an anti-reflective coating (ARC) layer on an etching object layer such that the ARC layer includes a polymer having an imide group; forming a photoresist pattern on the ARC layer; wet etching portions of the ARC layer exposed by the photoresist pattern to form an ARC layer pattern; and etching the etching object layer using the photoresist pattern as an etch mask to form the layer pattern.

A top surface of the etching object layer that directly contacts the ARC layer may include a binding site that is bonded with the imide group of the polymer of ARC layer by a hydrogen bond.

The binding site bonded with the imide group may include one or more of nitrogen, hydrogen, an OH group, a NH group, or oxygen.

The etching object layer may include one or more of a metal layer, a metal nitride layer, an insulation layer, or a semiconductor layer.

The etching object layer may include a titanium nitride layer.

The method may further include forming an insulation layer on a substrate such that the insulation layer includes a metal oxide, wherein the etching object layer is formed on the insulation layer.

Wet etching the ARC layer to form the ARC layer pattern may include wet etching the ARC layer using a wet etch solution including ammonia and hydrogen peroxide.

Forming the ARC layer may include coating a composition for forming the ARC layer such that the composition includes the polymer and a solvent, and the polymer for the ARC layer may include repeating units having the imide group.

The composition for forming the ARC layer may include about 10 to about 35 wt % of the polymer and about 65 to about 90 wt % of the solvent.

Forming the ARC layer may include coating a composition for forming the ARC layer, the composition including the polymer and a solvent, the polymer may have a backbone that includes imide groups, and functional groups may be bound to the backbone.

The functional groups may include a first functional group including a hydrocarbon functional group and a second functional group including an ester group.

The method, after forming the layer pattern, may further include removing the photoresist pattern; and removing the ARC layer pattern.

Removing the ARC layer pattern may include wet etching the ARC layer pattern using a wet etch solution including ammonia and hydrogen peroxide.

Forming the ARC layer may include baking at a temperature of about 150° C. to about 300° C.

Forming the photoresist pattern may include forming a photoresist layer on the ARC layer; baking the photoresist layer; and exposing and developing the photoresist layer to form the photoresist pattern.

The embodiments may also be realized by providing a method of manufacturing a layer pattern of a semiconductor device, the method including providing an etching object layer; forming an anti-reflective coating (ARC) layer on the etching object layer such that the ARC layer includes a polymer having an imide group in a backbone thereof; forming a photoresist pattern on the ARC layer; wet etching portions of the ARC layer exposed by the photoresist pattern to form an ARC layer pattern; and etching the etching object layer using the photoresist pattern as an etch mask to form the layer pattern.

The imide group may be included in a moiety represented by one of Structural Formulae 1 to 3, below:

Structural Formula 1

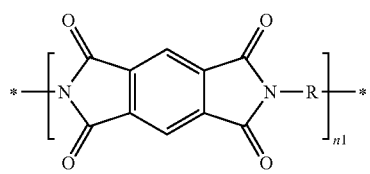

Structural Formula 2

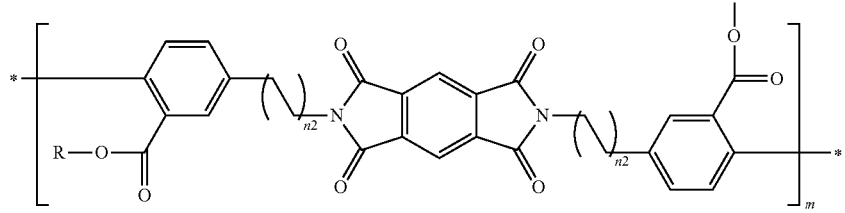

-continued

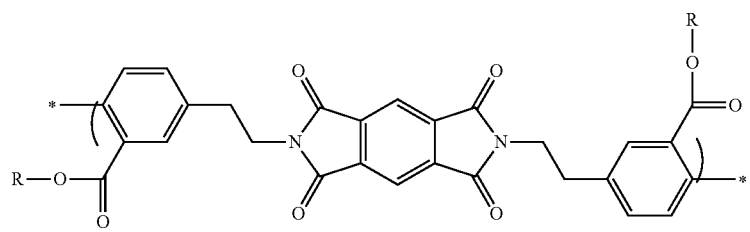

Structural Formula 3 wherein, in Structural Formulae 1 and 2, R may be an alkyl group, a cycloalkyl group, an aryl group, or a silyl alkyl group, having 1 to 10 carbon atoms.

The polymer may be soluble in an aqueous solution of ammonia and hydrogen peroxide.

The imide may be a pyromellitimide included in a repeating unit of the polymer, and the repeating unit polymer further includes an ester functional group bound to the backbone thereof.

Wet etching the ARC layer to form the ARC layer pattern may include wet etching the ARC layer using a wet etch solution including ammonia and hydrogen peroxide.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
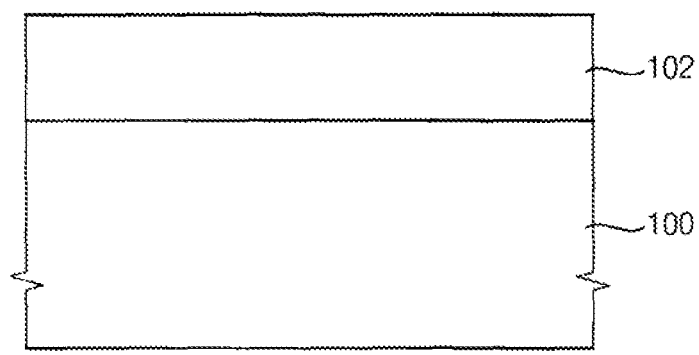
FIGS. 1, 2, and 4 to 9 illustrate cross-sectional views of stages in a method of forming a pattern of a layer in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Composition 1 for Forming an Anti-Reflective Coating Layer

Composition 1 for forming an anti-reflective coating (ARC) layer in accordance with an embodiment may include a polymer for forming an ARC layer with which a layer pattern having a good sidewall profile may be formed. Composition 1 may be used for forming a bottom ARC layer beneath a photoresist pattern.

The ARC layer prepared using Composition 1 may have enhanced characteristics, e.g., optical, etching, and/or surface characteristics in a photolithography process, so that a good photoresist pattern may be formed using the ARC layer. The ARC layer prepared using Composition 1 may have following characteristics.

First, the ARC layer may have good adhesive characteristics to an etching object layer. The ARC layer may be interposed between the etching object layer and a photoresist pattern, and the ARC layer may have good adhesive characteristics to the etching object layer. The photoresist pattern may be lifted-off to be removed from the etching object layer. Accordingly, forming a desired layer pattern may be facilitated.

Second, portions of the ARC layer exposed by the photoresist pattern may be easily removed. Also, the etching object layer may not be damaged when the ARC layer is removed.

Composition 1 may include a polymer for the ARC layer and a solvent. The polymer may have or may include an imide group.

The polymer for the ARC layer may have repeating units that include the imide group. For example, imide may be a pyromellitimide included in a repeating unit of the polymer. The polymer including the imide group may also include a benzene ring. For example, the polymer may include a polyimide. The polyimide may be synthesized using aromatic anhydride compounds and diamine compounds.

In an implementation, the repeating units including the imide group may have a structure represented by, e.g., the following Structural Formula 1.

Structural Formula 1

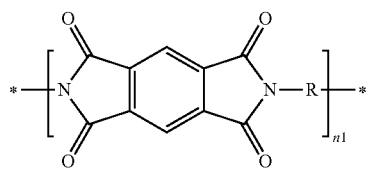

In Structural Formula 1, R may represent an alkyl group, a cycloalkyl group, an aryl group, a silyl alkyl group, or the like, having 1 to 10 carbon atoms.

In an implementation, the polymer for the ARC layer may have a weight-average molecular weight of about 1,000 to about 100,000, e.g., about 5,000 to about 100,000 or about 5,000 to about 10,000.

In an implementation, the polymer for the ARC layer may be included in the composition in an amount of about 10 wt % to about 35 wt %, based on a total weight of Composition 1 for the ARC layer. In an implementation, the solvent for the ARC layer may be included in the composition in an amount of about 65 wt % to about 90 wt %, based on the total weight of Composition 1 for the ARC layer. In an implementation, an amount of the polymer for the ARC layer may be in a range of about 10 wt % to about 25 wt %, and an amount of the solvent for the ARC layer may be in a range of about 75 wt % to about 90 wt %, based on the total weight of Composition 1 for the ARC layer.

Maintaining the amount of the polymer in the composition at about 10 wt % or greater may help ensure that the ARC layer is sufficiently coated and/or that the ARC layer absorbs light sufficiently. Maintaining the amount of the polymer for an ARC layer in the composition at about 35 wt % or less may help reduce the likelihood of and/or prevent an excessive increase in a viscosity of the composition, thereby helping to ensure that the ARC layer is uniformly applied.

Maintaining the amount of a solvent in the composition for an ARC layer at about 65 wt % or greater may facilitate forming the ARC layer to have a desired thickness using the composition for the ARC layer, due to the composition having a suitable viscosity. Maintaining an amount of the solvent included in the composition for an ARC layer at about 90 wt % or less may help ensure that generation of voids may be reduced and/or prevented.

In an implementation, the solvent for the ARC layer may include a mixture or a mixed solvent for dissolving a solid component of Composition 1 for the ARC layer to form the ARC layer, and may have good characteristics e.g., a low toxicity, and may provide for uniformity of thickness.

Examples of the solvent for the ARC layer may include an ester, an ether, a lactone, a ketone, a glycol ether, a glycol ether ester, or a mixture thereof. Examples of the solvent for the ARC layer may include ethylene glycol, propylene glycol methyl ether, methyl cellosolve acetate, ethyl cellosolve acetate, diethylene glycol monomethyl ether, diethylene glycol methyl ether, diethylene glycol dimethyl ether, ethyl lactate, methyl ethyl ketone, cyclohexanone, 2-heptanone, 3-heptanone, 4-heptanone, γ-butyrolactone, or a mixture thereof.

In an implementation, Composition 1 for the ARC layer may further include, e.g., a surfactant, a crosslinking activator, a deformer, an adhesion promoter, or the like. The surfactant may include, e.g., a nonionic, a cationic, an anionic, or an amphoteric surfactant. The crosslinking activator may include a component accelerating the cross-linking reaction between crosslinking agents, e.g. melamine, urea, or the like.

In an implementation, Composition 1 for the ARC layer may include the polymer having repeating units containing an imide group, which may help the ARC layer and the etching object layer bond to each other. Furthermore, the ARC layer may be selectively removed so that a minute pattern having an improved sidewall profile may be formed.

Composition 2 for Forming an ARC Layer

Composition 2 for forming an ARC layer in accordance with an example embodiment may include a polymer for forming an ARC layer and a solvent. The polymer may have or include an imide group. Composition 2 for the ARC layer in accordance with an example embodiment may be used for forming a bottom ARC layer beneath a photoresist pattern.

In an implementation, the polymer for the ARC layer may be included in the composition in an amount of about 10 wt % to about 35 wt %, based on a total weight of Composition 2 for the ARC layer. In an implementation, the solvent may be included in the composition in an amount of about 65 wt % to about 90 wt %, based on the total weight of Composition 2 for the ARC layer. In an implementation, an amount of the polymer for the ARC layer may be about 10 wt % to about 25 wt %, and an amount of the solvent for the ARC layer may be about 75 wt % to 90 wt %, based on the total weight of Composition 2 for the ARC layer.

The polymer for the ARC layer may have repeating units containing an imide group. The polymer may be or may include a polyimide in a backbone thereof, and may further include a variety of functional groups bonded or substituted on the backbone. The functional groups may help improve coating formation characteristics, adhesive properties, ability to be chemically bonded with each other between the functional groups, ability to crosslink, or the like.

The repeating unit including imide groups may include, e.g., a polymer having an imide group and a benzene ring as a backbone. A first functional group including a hydrocarbon and a second functional group including a ester group may be on the backbone. The polymer including an imide group and a benzene ring may be synthesized using, e.g., aromatic anhydride compounds and/or diamine compounds.

The repeating units including the imide group may have a structure represented by, e.g., the following Structural Formula 2.

Structural Formula 2

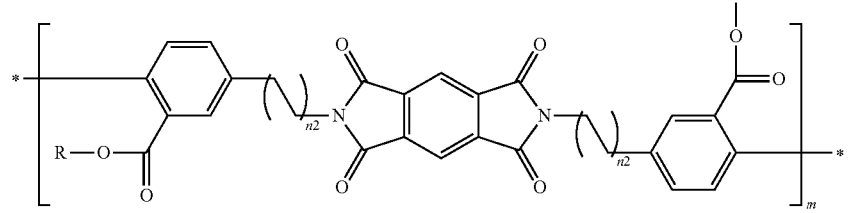

In Structural Formula 2, R may be an alkyl group, a cycloalkyl group, an aryl group, a silyl alkyl group, or the like, having 1 to 10 carbon atoms. In Structural Formula 2, n2 may be a number of 1 to 10.

In an implementation, the polymer for the ARC layer may have a weight-average molecular weight of about 1,000 to 100,000, e.g., about 5,000 to 100,000 or about 5,000 to 10,000.

The imide group included in the polymer for the ARC layer may help improve adhesive characteristics between the organic ARC layer and the etching object layer, and may also help improve removal characteristics of the organic ARC layer. A hydrocarbon chain included in the first functional group may help improve characteristics of the formation of the layer. Thus, the ARC layer may be easily formed. Furthermore, an ester group included in the second functional groups may help improve adhesive characteristics to the etching object layer under the ARC layer.

In an implementation, the polymer for the ARC layer may include the imide group. The polymer for the ARC layer may have the imide group in a backbone thereof, and may also include a variety of functional groups bonded or substituted on the backbone.

Method of Forming a Layer Pattern

FIGS. 1, 2, and 4 to 9 illustrate cross-sectional views of stages in a method of forming a layer pattern in accordance with example embodiments. Without being bound by theory, FIG. 3 illustrates a schematic diagram of bonding between an etching object layer and an ARC layer.

Referring to FIG. 1, an etching object layer 102 may be on a substrate 100. The etching object layer 102 may be formed on the substrate 100, or may be the substrate 100 itself. Hereinafter, only the case in which the etching object layer 102 is on the substrate 100 will be illustrated.

The etching object layer 102 may be a single layer or a multi-layered structure having a plurality of layers sequentially stacked. Without being bound by theory, it is believed that a top surface of the etching object layer 102 (directly contacting an ARC layer 104 (refer to FIG. 2)) may have a binding site that may form a hydrogen bond with an imide group of the ARC layer. For example, the binding site on the top surface of the etching object layer 102 may include at least one of nitrogen, hydrogen, an OH group, an NH group, and oxygen.

The etching object layer 102 may include various types of layers used in manufacturing a semiconductor device. The etching object layer 102 may include, e.g., a metal layer, a metal nitride layer, an insulation layer, a semiconductor layer, or the like.

Because a metal layer or metal nitride layer may exhibit poor adhesion to some ARC layers, patterning the metal layer or the metal nitride layer by a photolithography process may be difficult. According to an embodiment, a metal layer or a metal nitride layer (serving as the etching object layer 102) may be etched to form a minute pattern by a photolithography process. In an implementation, the etching object layer 102 may include titanium, titanium nitride, tungsten, tungsten nitride, or the like. In an implementation, the etching object layer 102 may include nitride, silicon nitride, silicon, silicon oxide, or the like.

After forming the etching object layer 102, the top surface of the etching object layer 102 may be cleaned.

Figure 2:
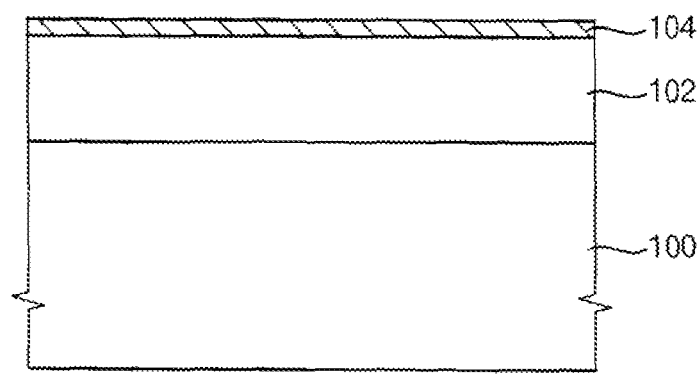
Figure 3:
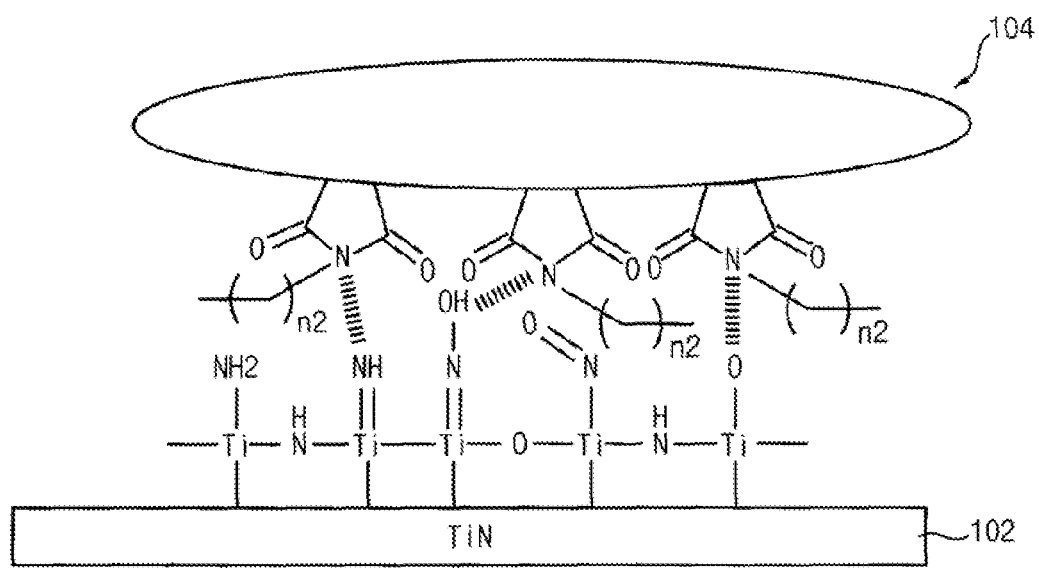
FIG. 3 illustrates a schematic view of interactions between a titanium nitride layer and an ARC layer including imide groups.

Referring to FIG. 2, the ARC layer 104 may be formed on the top surface of the object layer 102. The ARC layer 104 may include a polymer including an imide group, e.g., a polyimide. The ARC layer 104 may be a bottom ARC layer formed beneath a photoresist layer 106 (refer to FIG. 4).

An ARC layer may be used when forming a pattern having a line width less than about 30 nm by a photolithography process. If the ARC layer were not formed, forming a pattern having a good sidewall profile may be difficult. Thus, forming an ARC layer, which may have a good adhesive property to an etching object layer therebeneath and may be easily removed therefrom by an etching process and/or a cleaning process, may be desirable.

In example embodiments, a preliminary ARC layer may be formed using Composition 1 or Composition 2 (each including the imide group) by, e.g., a spin-coating process.

After forming the preliminary ARC layer by the spin coating process, the preliminary ARC layer may be baked to form the ARC layer 104. The baking process may be performed at a temperature of about 150° C. to about 300° C.

Without being bound by theory, it is believed that the imide group included in the ARC layer 104 and the binding site at the top surface of the etching object layer 102 may be strongly bonded with or attracted to each other. For example, an OH group, an NH group, or oxygen of the etching object layer 102 and the imide group of the ARC layer 104 may be combined with or attracted to each other by a hydrogen bond.

Without being bound by theory, referring to FIG. 3, e.g., a titanium nitride layer serving as the etching object layer 102 and the ARC layer 104 may be bonded or attracted to each other.

For example, at a top surface of the titanium nitride layer, chemical bonds, e.g. Ti—NH, Ti—NH$_2$, Ti=N, Ti=O, Ti—N=O, etc., may be formed. When the ARC layer 104 including the imide group is formed on the titanium nitride layer, NH—N, OH—N and O—N bonds or attractions may be formed at an interface between the titanium nitride layer and the ARC layer 104. The titanium nitride layer and the ARC layer 104 may be strongly bonded or attracted to each other.

Some types of organic ARC layers may be physically adhered to an underlying layer, thereby exhibiting poor adhesive properties thereto. Accordingly, the organic ARC layer may be torn out or removed during a subsequent photolithography process or etching process. However, the ARC layer 104 in accordance with example embodiments may include the imide group, which may be strongly bonded or attracted to the etching object layer 102 therebeneath, which may ease the subsequent photolithography process or etching process.

Figure 4:
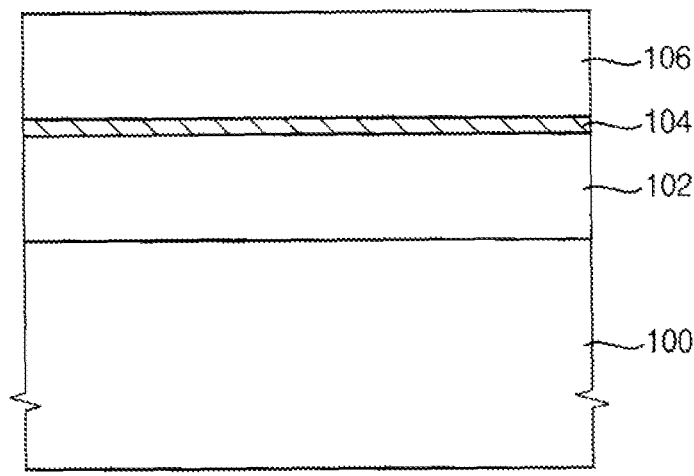

Referring to FIG. 4, the photoresist layer 106 may be formed on the ARC layer 104. For example, the photoresist layer 106 may include an acetal-containing acrylate monomer, environmentally stable chemical amplification photoresist (ESCAP) polymer, cycloolefin-maleic anhydride (COMA) copolymer, a hybrid of COMA and acrylate, or the like.

The photoresist layer 106 may be baked. In an implementation, the baking process may be performed at a temperature of about 70° C. to about 200° C. An adhesive property of the photoresist layer 106 to the ARC layer 104 may be improved by the baking process.

Figure 5:
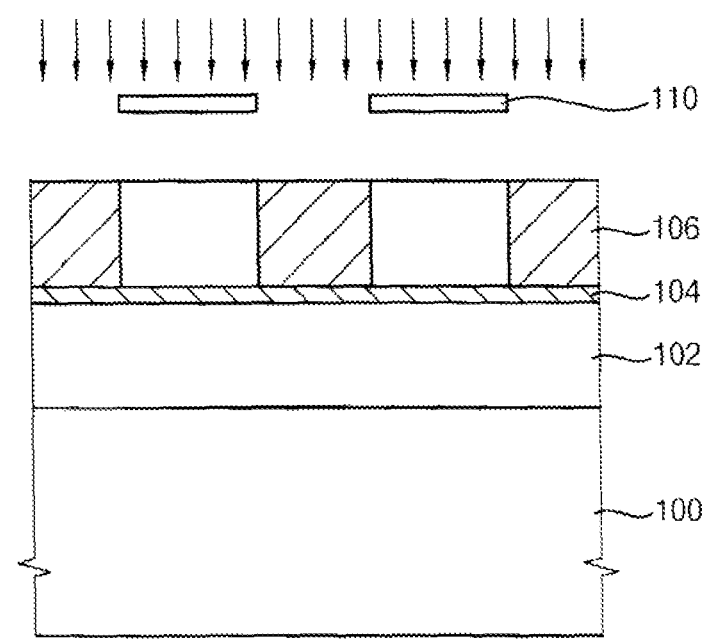

Referring to FIG. 5, the photoresist layer 106 may be selectively exposed.

In example embodiments, a photo mask 110 having a pattern may be placed on a mask stage (not shown), and the mask stage may be moved so that the photo mask 110 may be aligned to the photoresist layer 106. A light may be irradiated onto the photo mask 110, and thus, some portions of the photoresist layer 106 may be selectively irradiated by the light having penetrated through the photo mask 110. The light may include one of KrF, ArF, extreme ultra violet (EUV), VUV, E-beam, X-ray, ion beam, or the like. In an implementation, the exposure process may be performed using an energy of about 1 to 100 mJ/cm$^2$.

After performing the exposure process, a baking process may be further performed. The baking process may be performed at a temperature of about 70° C. to about 200° C.

Figure 6:
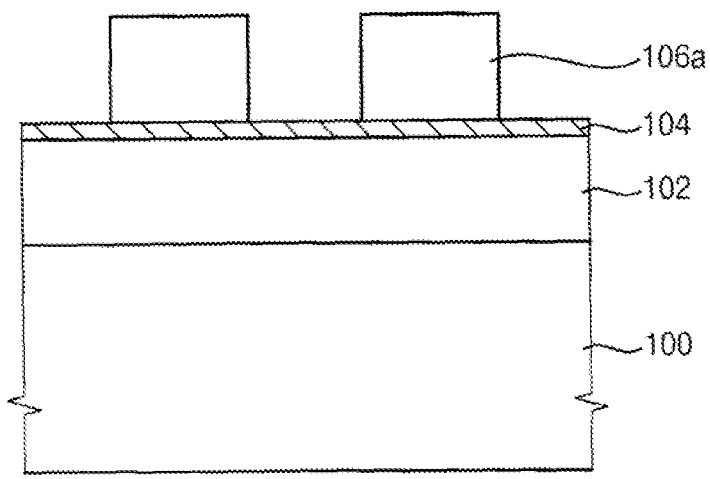

Referring to FIG. 6, portions of the photoresist layer 106 that have been irradiated with the light may be dissolved to be removed by a dissolving or developing solution, thereby forming a photoresist pattern 106a. The photoresist pattern 106a may have a very minute line width less than about 30 nm. The dissolving solution may include, e.g., about 0.01 wt % to about 5 wt % of tetra-methyl ammonium hydroxide (TMAH) aqueous solution.

Figure 7:
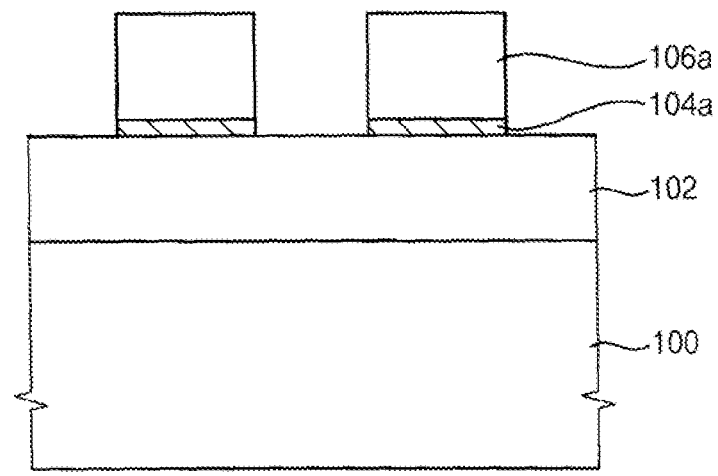

Referring to FIG. 7, the ARC layer 104 may be etched using the photoresist pattern 106a as an etch mask to form an ARC layer pattern 104a.

An aqueous solution including ammonia and hydrogen peroxide may be used as a wet etch solution in the etching process. For example, the wet etch solution may include NH$_4$OH, H$_2$O$_2$, and H$_2$O, and a ratio among them may be, e.g., about 1:1:5 to about 1:2:7.

When the wet etch solution is introduced onto the ARC layer 104, the imide group included in the material that forms ARC layer 104 may be converted according to following Formula.

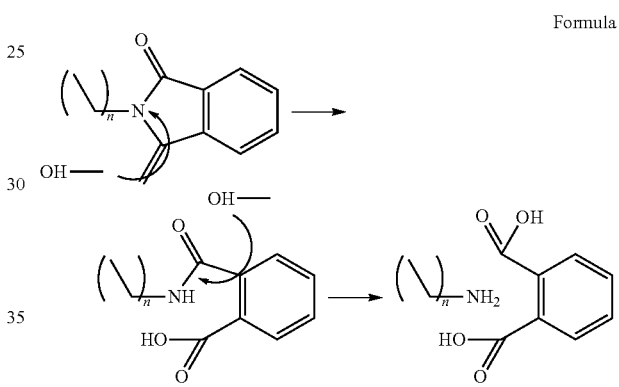

Formula

For example, a ring of the imide group may be opened by an —OH group from hydrogen peroxide to form hydrophilic phthalic acid. The imide group may be dissolved in a water-based solution, and thus may be easily removed.

In this way, the chemical bond of the ARC layer 104 may be broken to be removed by the wet etch solution, and thus the ARC layer 104 may be removed quickly.

Some types of organic ARC layers may be swollen in a wet etch solution to be removed not chemically but physically. Therefore, an etching object layer beneath the organic ARC layer may be removed together with the organic ARC layer. Thus, the etching object layer may be undesirably torn out.

According to an embodiment, the bonding between the ARC layer 104 and the etching object layer 102 therebeneath may be weakened by the wet etch solution, and thus the ARC layer 104 may be easily removed. Thus, the etching object layer 102 may not be torn out.

Figure 8:
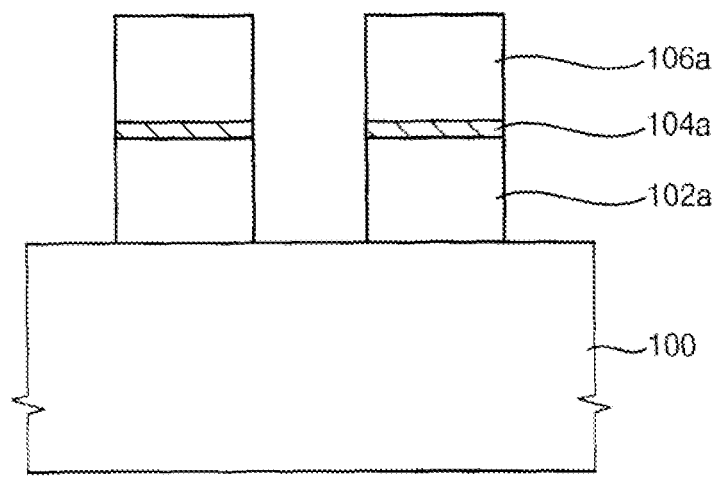

Referring to FIG. 8, the etching object layer 102 may be etched using the photoresist pattern 106a as an etch mask. As a result, the etching object layer 102 may be converted to an etching object layer pattern 102a.

During the etching process, the ARC layer pattern 104a may be strongly bonded by the hydrogen bond to portions of the etching object layer 102 that is masked with the photoresist pattern 106a. Therefore, the ARC layer pattern 104a and the photoresist pattern 106a may not be removed during the etching process.

The etching object layer 102 may be wet etched or dry etched. When the etching object layer 102 is a metal layer or a metal nitride layer, the etching object layer 102 may be wet etched.

Figure 9:
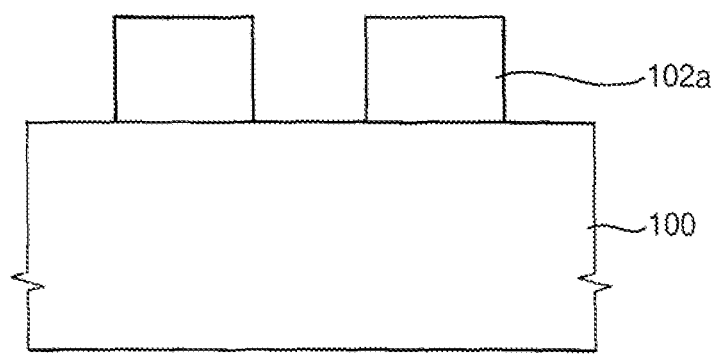

Referring to FIG. 9, the photoresist pattern 106a may be removed. In an implementation, the photoresist pattern 106a may be removed by an ashing process and/or a stripping process.

The ARC layer pattern 104a beneath the photoresist pattern 106a may be removed.

When the ARC layer pattern 104a is removed, a wet etch solution including about 1:1:5 to about 1:2:7 of $NH_4OH$, $H_2O_2$, and $H_2O$ may be used, like the process illustrated with reference to FIG. 5. Thus, the etching object layer pattern 102a may not be damaged during the removal of the ARC layer pattern 104. Furthermore, the ARC layer pattern 104a may be easily removed.

In example embodiments, a minute pattern having a line width less than about 30 nm may be easily formed.

Method of Forming a Gate Electrode

FIGS. 10 to 14 illustrate cross-sectional views of stages of a method of forming a gate electrode in accordance with example embodiments.

Figure 10:
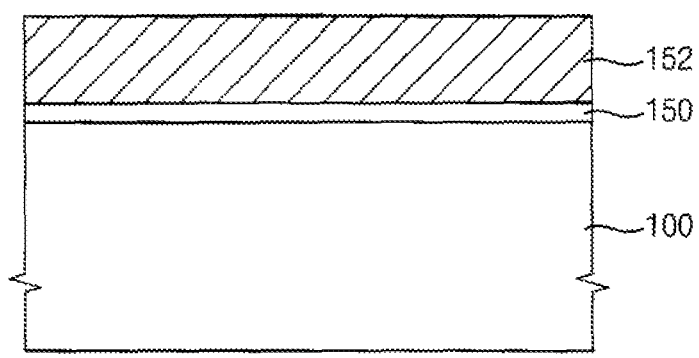
FIGS. 10 to 15 illustrate cross-sectional views of stages a method of forming a gate electrode in accordance with example embodiment.

Referring to FIG. 10, a gate insulation layer 150 may be formed on a substrate 100. The substrate 100 may be, e.g., a single crystalline silicon substrate, a silicon-on-insulator (SOI) substrate, etc.

The gate insulation layer 150 may be formed to include a metal oxide having a higher dielectric constant than silicon oxide. The metal oxide used for forming the gate insulation layer 150 may include, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, or the like. The gate insulation layer 150 may be a single layer, or a multi-layered structure having a plurality of layers sequentially stacked. When the gate insulation layer 150 is formed using a metal oxide having a high dielectric constant, a high performance transistor having a minute linewidth may be formed.

A gate electrode layer 152 may be formed on the gate insulation layer 150. When the gate insulation layer 150 is formed using a metal oxide, the gate electrode layer 152 may be formed using a metal.

In an implementation, the gate electrode layer 152 may include, e.g., titanium nitride, titanium, tantalum nitride, tantalum, or the like. These may be used alone or in a combination thereof. The gate electrode layer 152 may be formed to have a single layer or a multi-layered structure including a plurality of layers sequentially stacked.

Without being bound by theory, a top surface of the gate electrode layer 152 directly contacting an ARC layer 154 (see FIG. 11) may include a binding site that may form a hydrogen bond. For example, the binding site of the top surface of the gate electrode layer 152 may include nitrogen, hydrogen, an NH group, oxygen, or the like. In an implementation, an uppermost portion of the gate electrode layer 152 may be formed to include e.g., titanium nitride.

Figure 11:
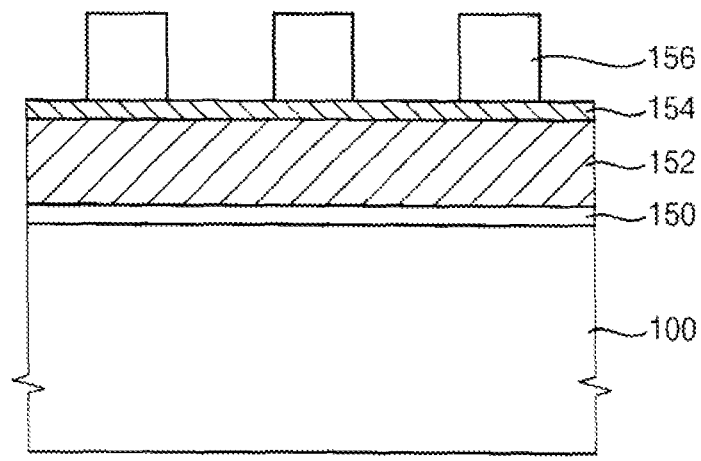

Referring to FIG. 11, the ARC layer 154 (including a polymer having an imide group) may be formed on the top surface of the gate electrode layer 152. The ARC layer 154 may be formed by processes substantially the same as or similar to those illustrated with reference to FIGS. 2 and 3.

A photoresist layer may be coated on a top surface of the ARC layer 154, and may be selectively exposed and developed to form a photoresist pattern 156. The photoresist pattern 156 may be formed by processes substantially the same as or similar to those illustrated with reference to FIGS. 4 to 6.

Figure 12:
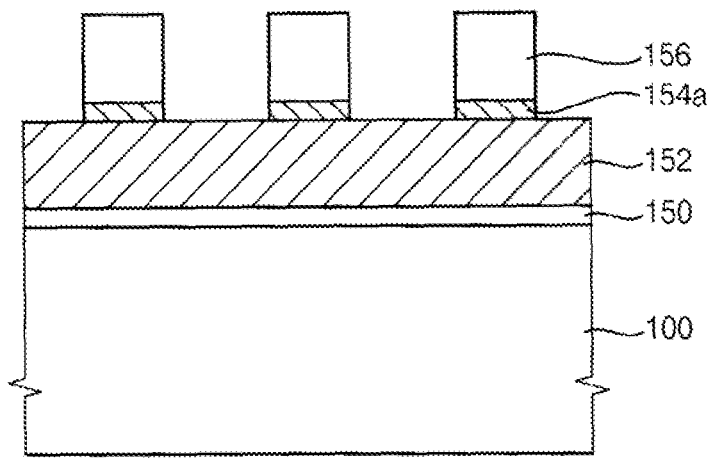

Referring to FIG. 12, the ARC layer 154 may be etched using the photoresist pattern 156 as an etch mask to form an ARC layer pattern 154a.

The ARC layer 154 may be wet etched. An aqueous solution including ammonia and hydrogen peroxide may be used as a wet etch solution in the etching process. For example, the wet etch solution may include $NH_4OH$, $H_2O_2$, and $H_2O$, and a ratio among them may be, e.g., about 1:1:5 to about 1:2:7. A chemical bond of the ARC layer 154 may be broken to then be removed by the wet etch solution, and thus the ARC layer 154 may be removed quickly. In addition, damage to the bottom surface of the gate electrode layer 152 may be reduced and/or prevented during the etching process.

Figure 13:
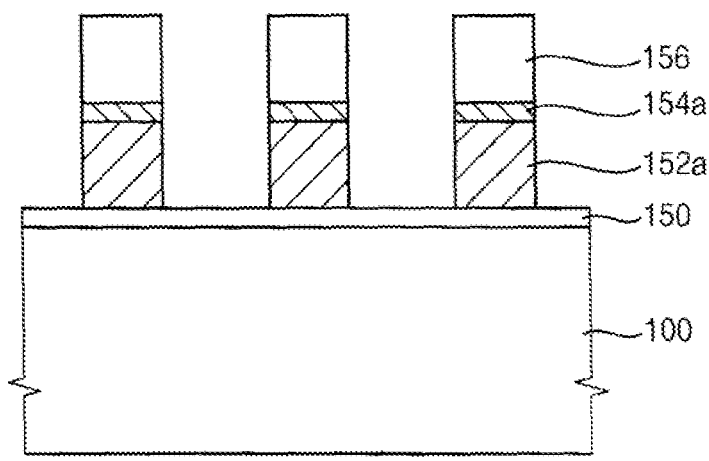

Referring to FIG. 13, the gate electrode layer 152 may be etched using the photoresist pattern 156 as an etch mask to form a gate electrode 152a on the gate insulation layer 150.

During the etching process, the ARC layer pattern 154a may be strongly adhered to portions of the gate electrode layer 152 that are masked or covered by the photoresist pattern 156. The ARC layer pattern 154a may not be lifted off, and thus, the photoresist pattern 156 may not be removed.

Figure 14:
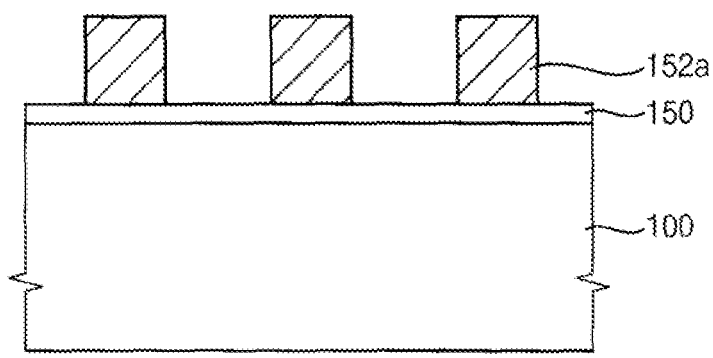

Referring to FIG. 14, the photoresist pattern 156 may be removed. Removing the photoresist pattern 156 may be performed by an ashing and/or a stripping process. The ARC layer pattern 154a beneath the photoresist pattern 156 may also be removed. In the process, an aqueous solution including ammonia and hydrogen peroxide may be used to remove the ARC layer pattern 154a. For example, the wet etch solution may include $NH_4OH$, $H_2O_2$, and $H_2O$, and a ratio among them may be, e.g., about 1:1:5 to about 1:2:7.

After performing the process, the gate electrode 152a having a minute linewidth and a metal may be formed. For example, the gate electrode 152a having a line width less than about 30 nm may be easily formed.

At least a portion of the gate insulation layer 150 exposed at sides of the gate electrode 152a may be removed during the process.

Figure 15:
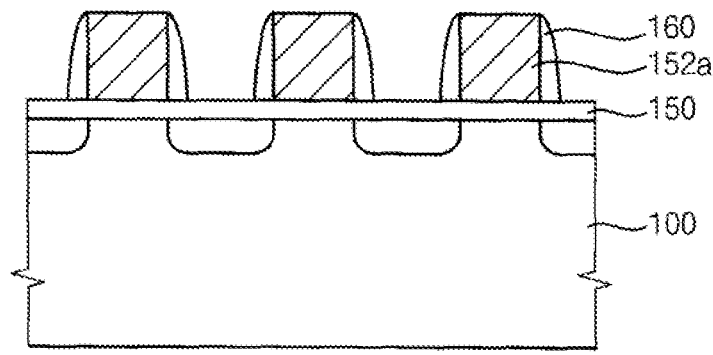

Referring to FIG. 15, a spacer 160 may be formed on a sidewall of the gate electrode 152a, and impurities may be implanted onto the substrate 100 adjacent to the gate electrode 152a to form source/drain regions 162. As a result, an MOS transistor may be formed.

The following Example and Comparative Example are provided in order to highlight characteristics of one or more embodiments, but it will be understood that the Example and Comparative Example are not to be construed as limiting the scope of the embodiments, nor is the Comparative Example to be construed as being outside the scope of the embodiments. Further, it will be understood that the embodiments are not limited to the particular details described in the Example and Comparative Example.

Experiment on Characteristics of ARC Layer

EXAMPLE

An ARC layer having a polymer including an imide group was formed on a substrate using Composition 2 (i.e., including a polymer and a solvent). The polymer had a structure represented by the following Structural Formula 3.

[Structural Formula 3]

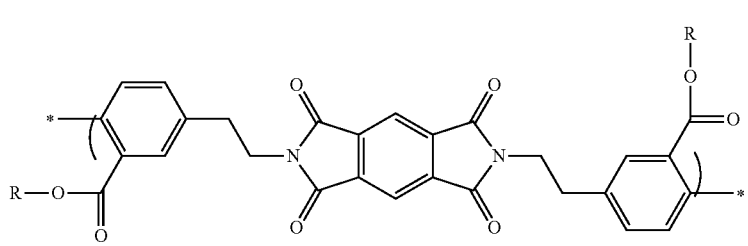

The ARC layer of the Example had about 20 wt % of the polymer and about 80 wt % of solvent, based on the total weight of the ARC layer. In addition, a weight-average molecular weight of the polymer was about 7500.

COMPARATIVE EXAMPLE

An ARC layer having a commonly used composition in accordance with Comparative Example was formed on a substrate. The ARC layer was formed using an acetal crosslinking agent. Particularly, DUV44 made by AMC Korea Inc. was used for the ARC layer.

The ARC layer in accordance with Comparative Example included no imide group.

The ARC layer in accordance with the Example was immersed into a wet etch solution including ammonia and hydrogen peroxide. A thickness of the ARC layer was measured and represented as a ratio according to time of immersion of the ARC layer in the wet etch solution.

The ARC layer in accordance with the Comparative Example was immersed into a wet solution including ammonia and hydrogen peroxide. A thickness of the ARC layer was measured and represented as a ratio according to time of immersion of the ARC layer in the wet etch solution.

Figure 16:
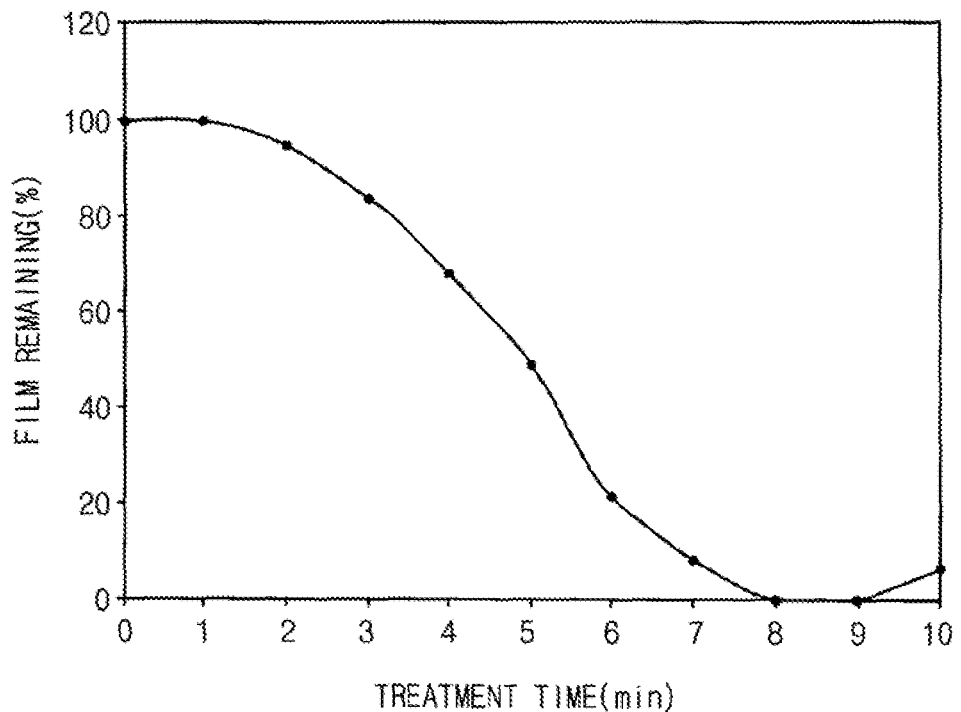
FIGS. 16 and 17 illustrate graphs showing characteristics of ARC layers of Example and Comparative Example, respectively.
Figure 17:
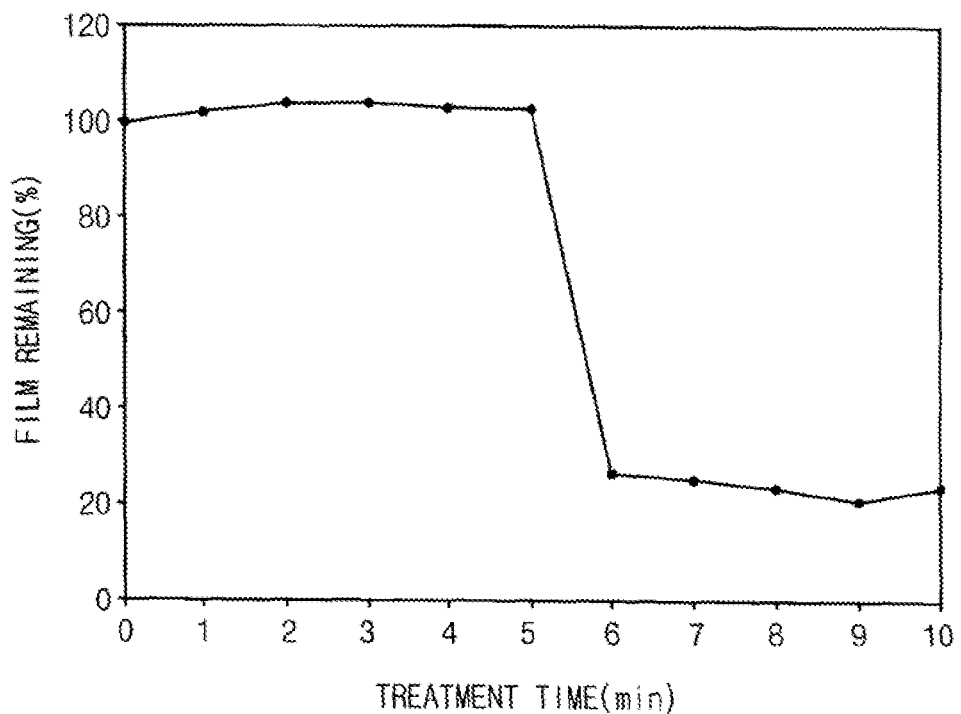

FIGS. 16 and 17 illustrate graphs showing characteristics of the ARC layers of the Example and Comparative Example, respectively.

In FIGS. 16 and 17, the X-axis represents an immersion time of the ARC layer in the wet etch solution, and the Y-axis represents a ratio of the thickness of the ARC layer remaining at the immersion time, when compared to that of the initial time.

Referring to FIG. 16, the ratio of the thickness of the ARC layer decreased as the immersion time of the ARC layer elapsed. For example, the ARC layer of the Example was removed gradually in accordance with the immersion time.

The ARC layer of the Example contacted the wet etch solution, and was chemically reacted with the wet etch solution to be removed from the etch object layer. In addition, the ARC layer of the sample wall was not peeled off by swelling.

Referring to FIG. 17, as the ARC layer of the Comparative Example contacted the wet etch solution for a certain period of time, the ratio of the thickness of the ARC layer was maintained. For example, the ratio of thickness of the ARC layer was still approximately 100% even after about 5 minutes.

Additionally, after a certain period of time, the thickness of the ARC layer of the Comparative Example was sharply reduced. The thickness of the ARC layer was about 30% after about 6 minutes.

The ARC layer of the Comparative Example was torn out due to swelling after a certain period of immersion time, rather than being gradually removed in accordance with the immersion time. For example, the ARC layer of the Comparative Example was not removed by a chemical reaction with the wet etch solution.

From the results of the experiment, it may be seen that the ARC layer in accordance with the Example was chemically and easily removed, without affecting the etching object layer.

The embodiments may be applied to formation of semiconductor devices including a pattern of a minute linewidth. For example, a gate electrode including a minute linewidth may be formed in accordance with an embodiment through simple processes.

By way of summation and review, in order to form a pattern having a minute linewidth and a good sidewall profile, an ARC layer may have a good adhesive characteristic to an etching object layer and may be easily removed therefrom.

The embodiments may provide methods of forming a layer pattern of a semiconductor device having a minute linewidth and a good sidewall profile.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a layer pattern of a semiconductor device, the method comprising:

forming an anti-reflective coating (ARC) layer on an etching object layer such that the ARC layer includes a polymer having an imide group;

forming a photoresist pattern on the ARC layer;

separately wet etching portions of the ARC layer exposed by the photoresist pattern to form an ARC layer pattern, the wet etching including using a wet etch solution differing from a developing solution used to form the photoresist pattern; and etching the etching object layer using the photoresist pattern as an etch mask to foam the layer pattern.

2. The method as claimed in claim 1, wherein a top surface of the etching object layer that directly contacts the ARC layer includes a binding site that is bonded with the imide group of the polymer of ARC layer by a hydrogen bond.

3. The method as claimed in claim 2, wherein the binding site bonded with the imide group includes one or more of nitrogen, hydrogen, an OH group, a NH group, or oxygen.

4. The method as claimed in claim 1, wherein the etching object layer includes one or more of a metal layer, a metal nitride layer, an insulation layer, or a semiconductor layer.

5. The method as claimed in claim 4, wherein the etching object layer includes a titanium nitride layer.

6. The method as claimed in claim 1, further comprising forming an insulation layer on a substrate such that the insulation layer includes a metal oxide, wherein the etching object layer is formed on the insulation layer.

7. The method as claimed in claim 1, wherein the wet etch solution includes ammonia and hydrogen peroxide.

8. The method as claimed in claim 1, wherein:
forming the ARC layer includes coating a composition for forming the ARC layer such that the composition includes the polymer and a solvent, and
the polymer for the ARC layer includes repeating units having the imide group.

9. The method as claimed in claim 8, wherein the composition for forming the ARC layer includes about 10 to about 35 wt % of the polymer and about 65 to about 90 wt % of the solvent.

10. The method as claimed in claim 1, wherein:
forming the ARC layer includes coating a composition for forming the ARC layer, the composition including the polymer and a solvent,
the polymer has a backbone that includes imide groups, and
functional groups are bound to the backbone.

11. The method as claimed in claim 10, wherein the functional groups include a first functional group including a hydrocarbon functional group and a second functional group including an ester group.

12. The method as claimed in claim 1, after forming the layer pattern, further comprising:
removing the photoresist pattern; and
removing the ARC layer pattern.

13. The method as claimed in claim 12, wherein removing the ARC layer pattern includes wet etching the ARC layer pattern using a wet etch solution including ammonia and hydrogen peroxide.

14. The method as claimed in claim 1, wherein forming the ARC layer includes baking at a temperature of about 150° C. to about 300° C.

15. The method as claimed in claim 1, wherein forming the photoresist pattern includes:
forming a photoresist layer on the ARC layer;
baking the photoresist layer; and
exposing and developing the photoresist layer to form the photoresist pattern.

16. A method of manufacturing a layer pattern of a semiconductor device, the method comprising:
providing an etching object layer;
forming an anti-reflective coating (ARC) layer on the etching object layer such that the ARC layer includes a polymer having an imide group in a backbone thereof, the imide group being included in a repeating unit of the polymer, and the repeating unit further including an ester functional group bound to the backbone thereof;
forming a photoresist pattern on the ARC layer;
wet etching portions of the ARC layer exposed by the photoresist pattern to form an ARC layer pattern; and
etching the etching object layer using the photoresist pattern as an etch mask to form the layer pattern.

17. The method as claimed in claim 16, wherein the imide group is included in a moiety represented by one of Structural Formulae 2 to 3, below:

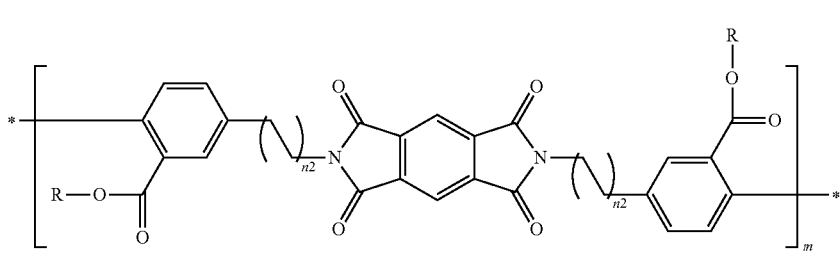

Structural Formula 2

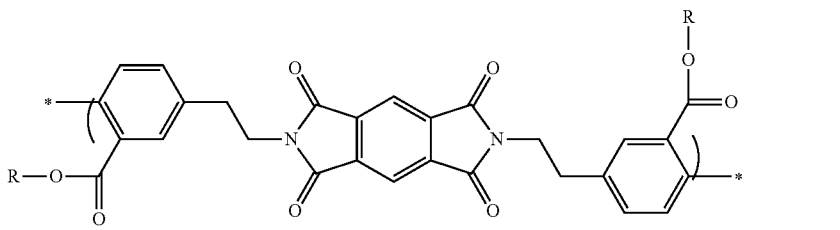

Structural Formula 3 wherein, in Structural Formulae 2 and 3, R is an alkyl group, a cycloalkyl group, an aryl group, or a silyl alkyl group, having 1 to 10 carbon atoms.

18. The method as claimed in claim 16, wherein the polymer is soluble in an aqueous solution of ammonia and hydrogen peroxide.

19. The method as claimed in claim 16, wherein the imide group is synthesized from a dianhydride compound and a diamine compound, and the ester functional group is combined to the diamine compound.

20. The method as claimed in claim 16, wherein wet etching the ARC layer to form the ARC layer pattern includes wet etching the ARC layer using a wet etch solution including ammonia and hydrogen peroxide.

* * * * *